(12) United States Patent
Kong et al.

(10) Patent No.: US 8,326,640 B2
(45) Date of Patent: Dec. 4, 2012

(54) METHOD AND SYSTEM FOR MULTI-BAND AMPLITUDE ESTIMATION AND GAIN CONTROL IN AN AUDIO CODEC

(75) Inventors: Hongwei Kong, Denville, NJ (US); Taiyi Cheng, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 1060 days.

(21) Appl. No.: 12/248,499

(22) Filed: Oct. 9, 2008

(65) Prior Publication Data

US 2010/0057477 A1   Mar. 4, 2010

Related U.S. Application Data

(60) Provisional application No. 61/091,862, filed on Aug. 26, 2008.

(51) Int. Cl.
*G10L 19/00*   (2006.01)

(52) U.S. Cl. ........ 704/502; 704/500; 704/229; 704/225; 704/200.1; 704/219; 341/143; 708/313; 708/316; 370/465; 375/240

(58) Field of Classification Search .......... 704/500–504, 704/229, 225, 200.1, 219; 341/143; 708/313, 708/316, 300; 329/319; 370/465; 375/240
See application file for complete search history.

(56) References Cited

U.S. PATENT DOCUMENTS

| | | | | |
|---|---|---|---|---|
| 5,404,377 | A * | 4/1995 | Moses | 375/145 |
| 5,473,631 | A * | 12/1995 | Moses | 375/130 |
| 7,050,972 | B2 * | 5/2006 | Henn et al. | 704/228 |
| 7,191,121 | B2 * | 3/2007 | Liljeryd et al. | 704/219 |
| 7,463,170 | B2 | 12/2008 | Kong et al. | |
| 7,515,071 | B2 | 4/2009 | Kong et al. | |
| 7,912,728 | B2 | 3/2011 | Kong et al. | |
| 8,085,959 | B2 * | 12/2011 | Chabries et al. | 381/312 |
| 2002/0103637 | A1 * | 8/2002 | Henn et al. | 704/206 |
| 2004/0078194 | A1 * | 4/2004 | Liljeryd et al. | 704/200.1 |
| 2004/0078205 | A1 * | 4/2004 | Liljeryd et al. | 704/503 |
| 2004/0125878 | A1 * | 7/2004 | Liljeryd et al. | 375/242 |
| 2005/0136848 | A1 | 6/2005 | Murray | |
| 2006/0031064 | A1 * | 2/2006 | Liljeryd et al. | 704/219 |
| 2008/0130913 | A1 | 6/2008 | Kong | |
| 2008/0130916 | A1 | 6/2008 | Kong | |
| 2008/0133224 | A1 | 6/2008 | Kong | |
| 2011/0036489 | A1 * | 2/2011 | Goldsmith et al. | 156/185 |

* cited by examiner

*Primary Examiner* — Vijay B Chawan

(74) *Attorney, Agent, or Firm* — Sterne, Kessler, Goldstein & Fox PLLC

(57) ABSTRACT

Aspects of a method and system for multi-band amplitude estimation and gain control in an audio CODEC are provided. In this regard, an audio signal may be filtered and delayed to generate one or more sub-band signals, a gain may be applied to each sub-band signal to generate one or more level adjusted sub-band signals, and the one or more level adjusted signals may be added to a delayed version of the audio signal. The gain applied to a particular one of the one or more sub-band signals may be controlled based on a detected amplitude of a summed signal derived by summing the particular one of the one or more sub-band signals and a corresponding one of the one or more level-adjusted sub-band signals.

20 Claims, 7 Drawing Sheets

METHOD AND SYSTEM FOR MULTI-BAND AMPLITUDE ESTIMATION AND GAIN CONTROL IN AN AUDIO CODEC

CROSS-REFERENCE TO RELATED APPLICATIONS/INCORPORATION BY REFERENCE

This application makes reference to, claims priority to and claims benefit from U.S. Provisional Patent Application Ser. No. 61/091,862 filed on Aug. 26, 2008.

This application also makes reference to U.S. Provisional Patent Application Ser. No. 61/091,840 filed on Aug. 26, 2008.

Each of the above stated applications is hereby incorporated herein by reference in its entirety.

FIELD OF THE INVENTION

Certain embodiments of the invention relate to processing of audio signals. More specifically, certain embodiments of the invention relate to a method and system for multi-band amplitude estimation and gain control in an audio CODEC.

BACKGROUND OF THE INVENTION

In audio applications, systems that provide audio interface and processing capabilities may be required to support duplex operations, which may comprise the ability to collect audio information through a sensor, microphone, or other type of input device while at the same time being able to drive a speaker, earpiece of other type of output device with processed audio signal. In order to carry out these operations, these systems may comprise audio processing devices that provide appropriate gain, filtering, analog-to-digital conversion, and/or other processing of audio signals in an uplink direction and/or a downlink direction. In the downlink direction, an audio processing device may condition and/or process baseband audio signals from a receiver for presentation via audio output devices such as a loudspeaker and headphones. In an uplink direction, an audio processing device may process and/or condition audio signals received from an input device such as a microphone and convey the processed signals to a transmitter.

Limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for multi-band amplitude estimation and gain control in an audio CODEC, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for audio level detection and control. In certain embodiments of the invention, an audio signal may be filtered and delayed to generate one or more sub-band signals, a gain may be applied to each sub-band signal to generate one or more level adjusted sub-band signals, and the one or more level adjusted signals may be added to a delayed version of the audio signal. The gain applied to a particular one of the one or more sub-band signals may be controlled based on a detected amplitude of a summed signal derived by summing the particular one of the one or more sub-band signals and a corresponding one of the one or more level-adjusted sub-band signals. The amplitude of the summed signal may be detected utilizing an envelope detector. The gain may be controlled based on a subjective loudness curve. The gain may be controlled utilizing a look-up table. The gain may be controlled based on an audio output device for which the audio signal may be destined. The gain may be controlled based on an input device from which the audio signal originated. The detected amplitude may be compared to a reference value to determine a target value of the gain, and the gain may be repeatedly incrementing over a plurality of samples to adjust the gain to the target value.

Figure 1:
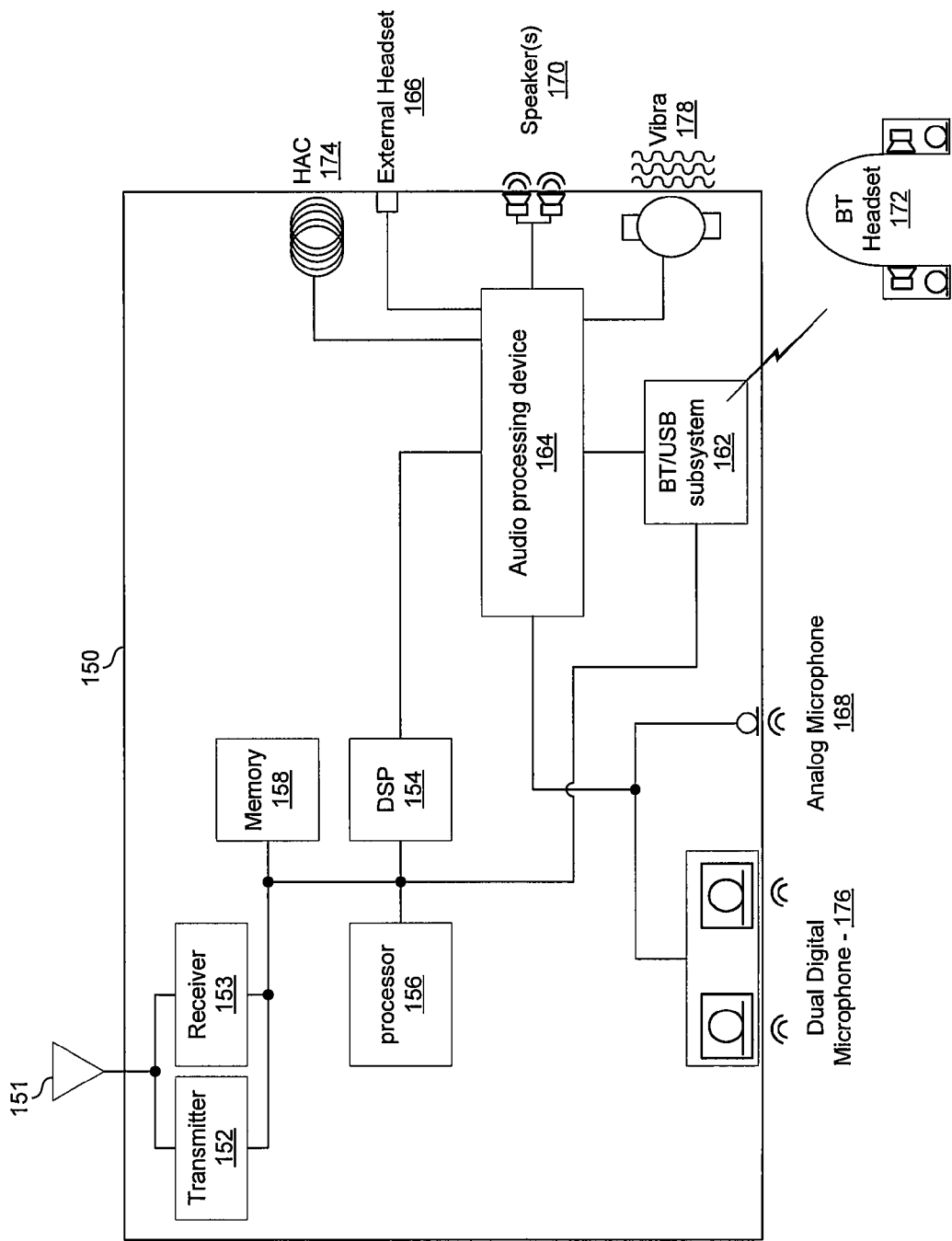
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless system 150 may comprise an antenna 151, a transmitter 152, a receiver 153, a digital signal processor 154, a processor 156, a memory 158, a Bluetooth (BT) and/or Universal Serial Bus (USB) subsystem 162, an audio processing device 164, an external headset port 166, an analog microphone 168, speaker(s) 170, a Bluetooth headset 172, a hearing aid compatibility (HAC) coil 174, a dual digital microphone 176, and a vibration transducer 178. The antenna 151 may be used for reception and/or transmission of RF signals. Different wireless systems may use different antennas for transmission and reception.

The transmitter 152 may comprise suitable logic, circuitry, and/or code that may be operable to modulate and up-convert baseband signals to RF signals for transmission by one or more antennas, which may be represented generically by the antenna 151. The transmitter 152 may be operable to execute other functions, for example, filtering the baseband and/or RF signals, and/or amplifying the baseband and/or RF signals. Although a single transmitter 152 is shown, the invention is not so limited. Accordingly, there may be a plurality of transmitters and/or receivers. In this regard, the plurality of transmitters may enable the wireless system 150 to handle a plurality of wireless protocols and/or standards including cellular, wireless local area networking (WLAN), and personal area networking (PAN). In addition, the transmitter 152 may be combined with the receiver 153 and implemented as a combined transmitter and receiver (transceiver).

The receiver 153 may comprise suitable logic, circuitry, and/or code that may be operable to down-convert and demodulate received RF signals to baseband signals. The RF signals may be received by one or more antennas, which may be represented generically by the antenna 151. The receiver 153 may be operable to execute other functions, for example, filtering the baseband and/or RF signals, and/or amplifying the baseband and/or RF signals. Although a single receiver 153 is shown, the invention is not so limited. Accordingly, there may be a plurality of receivers. In this regard, the plurality of receivers may enable the wireless system 150 to handle a plurality of wireless protocols and/or standards including cellular, WLAN, and PAN. In addition, the receiver 153 may be implemented as a combined transmitter and receiver (transceiver).

The DSP 154 may comprise suitable logic, circuitry, and/or code operable to process audio signals. In various embodiments of the invention, the DSP 154 may encode, decode, modulate, demodulate; encrypt, and/or decrypt audio signals. In this regard, the DSP 154 may be operable to perform computationally intensive processing of audio signals.

The processor 156 may comprise suitable logic, circuitry, and/or code that may be operable to configure and/or control one or more portions of the system 150, control data transfers between portions of the system 150, and/or otherwise process data. Control and/or data information may be transferred between the processor 156 and one or more of the transmitter 152, the receiver 153, the DSP 154, the memory 158, the audio processing device 164, and the BT and/or USB subsystem 162. The processor 156 may be utilized to update and/or modify programmable parameters and/or values in one or more of the transmitter 152, the receiver 153, the DSP 154, the memory 158, the audio processing device 164, and the BT and/or USB subsystem 162. In this regard, a portion of the programmable parameters may be stored in the system memory 158. The processor 156 may be any suitable processor or controller. For example, the processor may be a reduced instruction set computing (RISC) microprocessor such as an advanced RISC machine (ARM), advanced virtual RISC (AVR), microprocessor without interlocked pipeline stages (MIPS), or programmable intelligent controller (PIC).

The system memory 158 may comprise suitable logic, circuitry, and/or code that may be operable to store a plurality of control and/or data information, including parameters needed to configure one or more of the transmitter 152, the receiver 153, the DSP 154, and/or the audio processing device 164. The system memory 158 may store at least a portion of the programmable parameters that may be manipulated by the processor 156.

In an exemplary embodiment of the invention, the DSP 154 and processor 156 may exchange audio data and control information via the memory 158. For example, the processor 156 may write encoded audio data, such as MP3 or AAC audio, to the memory 158 and the memory may pass the encoded audio data to the DSP 154. Accordingly, the DSP 154 may decode the data and write pulse-code modulated (PCM) audio back into the shared memory for the processor 156 to access and/or to be delivered to the audio processing device 164.

The BT and/or USB subsystem 162 may comprise suitable circuitry, logic, and/or code that may be operable to transmit and receive Bluetooth and/or Universal Serial Bus (USB) signals. The BT and/or USB subsystem 162 may be operable to up-convert, down-convert, modulate, demodulate, and/or otherwise process BT and/or USB signals. In this regard, the BT and/or USB subsystem 162 may handle reception and/or transmission of BT and/or USB signals via a wireless communication medium and/or handle reception and/or transmission of USB signals via a wireline communication medium. Information and/or data received via a BT and/or USB connection may be communicated between the BT and/or USB subsystem 162 and one or more of the transmitter 152, the receiver 153, the DSP 154, the processor 156, the memory 158, and the audio processing device 164. For example, the BT and/or USB subsystem 162 may extract audio from a received BT and/or USB signal and may convey the audio to other portions of the wireless system 150 via an inter-IC sound ($I^2S$) bus. Information and/or data may be communicated from one or more of the transmitter 152, the receiver 153, the DSP 154, the processor 156, the memory 158, and the audio processing device 164 to the BT and/or USB subsystem 162 for transmission over a BT and/or USB connection. For example, audio signals may be received from other portions of the wireless system 150 via an I2S bus and the audio signal may be transmitted via a BT and/or USB connection. Additionally, control and/or feedback information may be communicated between the BT and/or USB subsystem 162 and one or more of the transmitter 152, the receiver 153, the DSP 154, the processor 156, the memory 158, and the audio processing device 164.

The audio processing device 164 may comprise suitable circuitry, logic, and/or code that may process audio signals received from and/or communicated to input and/or output devices. The input devices may be within or communicatively coupled to the wireless device 150, and may comprise, for example, the analog microphone 168, the stereo speakers 170, the Bluetooth headset 172, the hearing aid compatible (HAC) coil 174, the dual digital microphone 176, and the vibration transducer 178. The audio processing device 164 may up-sample and/or down-sample audio signals to one or more desired sample rates for processing and/or transmission via an output device. In this regard, the audio processing device 164 may also be enabled to handle a plurality of data sampling rate inputs. For example, the audio processing device 164 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The audio processing device 164 may be enabled to handle a plurality of digital audio inputs of various resolutions, such as 16 or 18-bit resolution, for example. The audio processing device 164 may support mixing of a plurality of audio sources. For example, the audio processing device 164 may support audio sources such as general audio, polyphonic ringer, $I^2S$ FM audio, vibration driving signals, and voice. In an exemplary embodiment of the invention, the general audio and polyphonic ringer sources may support the plurality of sampling rates that the audio processing device 164 may be enabled to accept, while the voice source may support a portion of the plurality of sampling rates, such as 8 kHz and 16 kHz.

The audio processing device 164 may utilize a programmable infinite impulse response (IIR) filter and/or a programmable finite impulse response (FIR) filter for at least a portion of the audio sources to compensate for passband amplitude and phase fluctuation for different input and/or output devices. In this regard, filter coefficients may be configured or programmed dynamically based on operations. Moreover, filter coefficients may all be switched in one-shot or may be switched sequentially, for example. The audio processing device 164 may also utilize a modulator, such as a Delta-Sigma ($\Delta\Sigma$) modulator, for example, to code digital output signals for analog processing. The audio processing device 164 may be referred to, for example, as an audio coding and/or decoding device or CODEC. In various embodiments of the invention, the audio processing device 164 may be implemented in dedicated hardware.

The external headset port 166 may comprise a physical connection for an external headset to be communicatively coupled to the wireless system 150. The headset may, for example, be an analog headset comprising a microphone and a pair of stereo transducers. Alternatively, the headset may be a digital headset which may utilize a protocol such as USB for communicating audio information.

The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The one or more speakers 170 may be operable to generate acoustic waves from electrical signals received from the audio processing device 164. In an exemplary embodiment of the invention, there may be a pair of speakers which may be operable to output acoustic waves corresponding to, for example, left and right stereo channels.

The Bluetooth headset 172 may comprise a wireless headset that may be communicatively coupled to the wireless system 150 via the BT and/or USB subsystem 162. In this manner, the wireless system 150 may be operated in a hands-free mode, for example.

The HAC coil 174 may comprise suitable circuitry, logic, and/or code that may enable communication between the wireless device 150 and a hearing aid, for example. In this regard, audio signals may be magnetically coupled from the HAC coil 174 to a coil in a user's hearing aid.

The dual digital microphone 176 may comprise suitable circuitry, logic, and/or code that may detect sound waves and convert them to electrical signals. The electrical signals generated by the dual digital microphone 176 may comprise digital signals, and thus may not require analog to digital conversion prior to digital processing in the audio processing device 164.

The vibration transducer 178 may comprise suitable circuitry, logic, and/or code that may be operable to notify a user of events on the wireless device 150 such as calendar reminders, a low battery notification, a received signal strength notification, an incoming call, and an incoming message without the use of sound. Aspects of the invention may enable the vibration transducer 178 to generate vibrations that may be in synch with, for example, audio signals such as speech, music, ringtones, and/or continuous wave (CW) tones.

In operation, audio signals from the analog microphone 168, the digital microphone 176, the receiver 153, the processor 156, and/or the memory 158 may be conveyed to the DSP 154. The DSP 154 may process the signals to generate baseband audio signals to the audio processing device 164. Additionally, baseband audio signals may be conveyed from the BT and/or USB subsystem 162 to the audio processing device 164.

The audio processing device 164 may process and/or condition one or more of the baseband audio signals to make them suitable for conveyance to the one or more speakers 170, the headset 166, the HAC 174, the vibration transducer 178, the transmitter 152, and/or the BT and/or USB subsystem 162. In this regard, the audio processing device 164 may be operable to detect amplitudes of processed audio signals in one or more frequency bands and condition audio signals based on a subjective loudness curve. In this manner, aurally pleasing audio may be presented to a user utilizing limited resources and/or capabilities as are often available in portable electronic devices. Additionally, detected signal amplitudes may be utilized to generate an audio visualization. For example, one or more LEDs or an image displayed by the wireless system 150 may be controlled based on the detected signal amplitudes.

Figure 2:
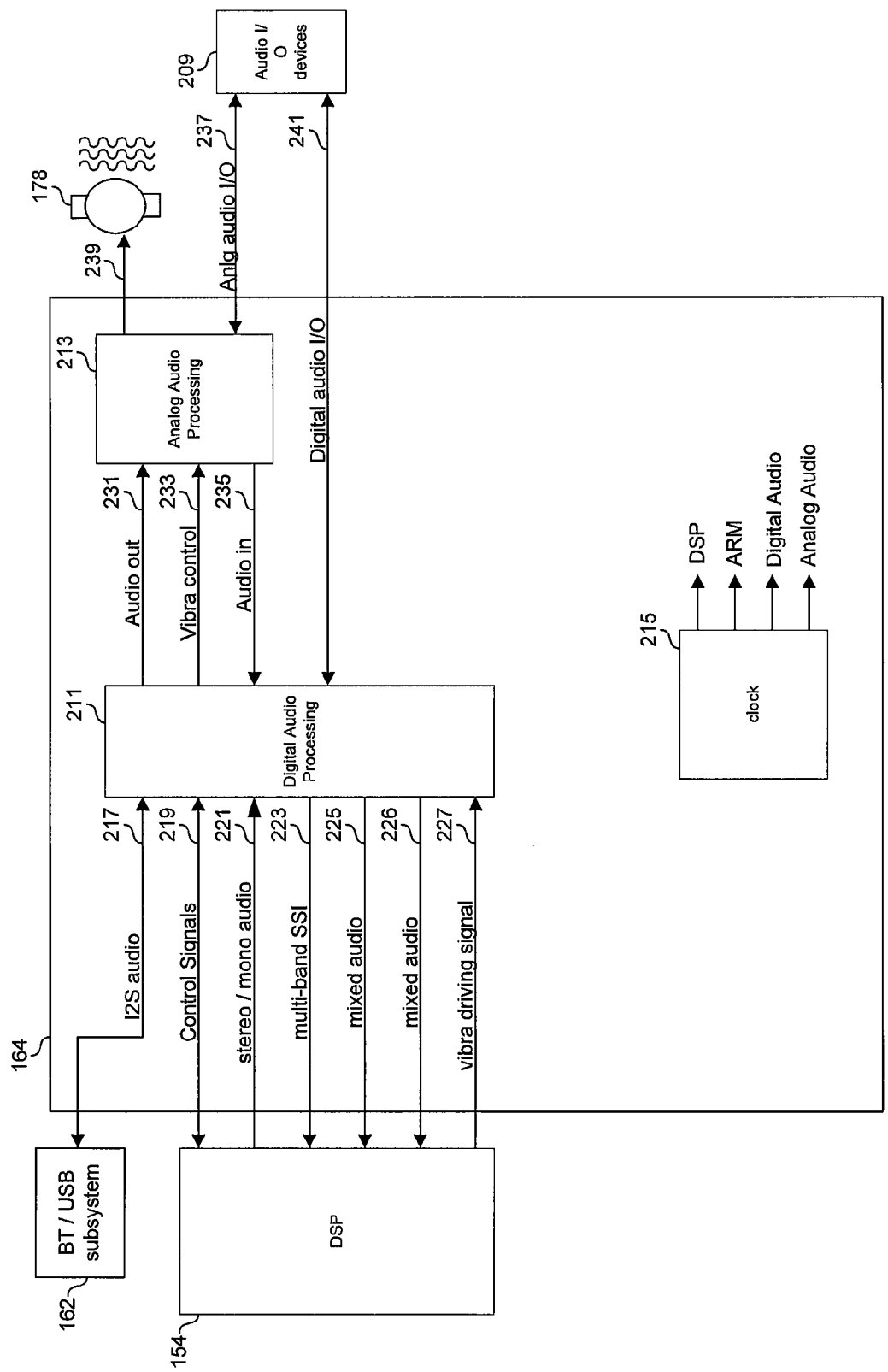
FIG. 2 is a block diagram illustrating an exemplary audio processing device, in accordance with an embodiment of the invention.

FIG. 2 is a block diagram illustrating an exemplary audio processing device, in accordance with an embodiment of the invention. Referring to FIG. 2, there is shown the DSP 154, the BT and/or USB subsystem 162, the audio processing device 164, and audio input and/or output devices 209. The audio input and/or output devices 209 may comprise one or more devices such as the external headset port 166, the analog microphone 168, the speakers 170, the Bluetooth headset 172, the hearing aid compatibility (HAC) coil 174, the dual digital microphone 176, and the vibration transducer 178 described with respect to FIG. 1. The DSP 154 and the BT and/or USB subsystem 162 may be as described with respect to FIG. 1. The audio processing device 164 may be as described with respect to FIG. 1 and may comprise a digital portion 211, an analog portion 213, and a clock 215.

The digital portion 211 may comprise suitable logic, circuitry, and/or code that may enable processing audio signals in the digital domain. In this regard, the digital portion 211 may be operable to filter, buffer, up-sample, down-sample, apply a digital gain or attenuation to, route, and/or otherwise condition digital audio signals. Additional details of the digital portion 211 are described below with respect to FIGS. 3, and 4A-4E.

The analog portion 213 may comprise suitable logic, circuitry, and/or code that may enable converting digital audio signals to an analog representation and amplifying and/or buffering the analog signals for driving audio output devices. Additional details of the digital portion 211 are described below with respect to FIG. 3.

The clock 215 may comprise suitable logic, circuitry, and/or code that may be operable to generate one or more periodic signals. The clock 215 may, for example, comprise one or more crystal oscillators, phase locked loops (PLLs), and/or direct digital frequency synthesizers (DDFS). The clock 215 may output a plurality of signals each with a distinct frequency and/or phase. The signals output by the clock 215 may be conveyed to one or more of the digital portion 211, the analog portion 213, the DSP 154, the memory 158, and/or the processor 156.

In various exemplary embodiments of the invention, one or more audio signals 217 may be communicated between the digital portion 211 and the BT and/or USB subsystem 162 via an inter-IC sound ($I^2S$) bus. Each of the audio signals 217 may be a monaural channel, a left stereo channel, or a right stereo channel. In an exemplary embodiment of the invention, the BT and/or USB subsystem 162 may be enabled to receive FM broadcast radio and thus two signals 217 comprising left and right channels of FM radio data may be conveyed to the digital portion 211 via an I²S bus.

In various exemplary embodiments of the invention, one or more output audio signals 231, vibration control 233, and input audio signals 235 may be communicated between the digital portion 211 and the analog portion 213.

The output audio signals 231 may each comprise one or more digital audio signals which have been suitably processed and/or conditioned by the digital portion 211 for output via one or more of the audio output devices 209. Each of the audio signals 231 may be a monaural channel, a left stereo channel, or a right stereo channel. Each of the output audio signals 231 may be converted to an analog representation and amplified by the analog portion 213.

The input audio signals 235 and 241 from an audio input device 209 may each comprise one or more digital audio signals to be processed by the digital portion 211. The input audio signals 235 and/or 241 may comprise monaural and/or stereo audio data which the digital portion 211 may process for conveyance to the DSP 154 and transmission to a remote wireless device. The input audio signals 235 and/or 241 may comprise monaural and/or stereo audio data which the digital portion 211 may process in a "loopback" path for conveyance to one or more audio output devices 209.

The vibration control signal 233 may be pulse width modulated square wave that may, after being amplified by the analog portion 213, control vibration of the vibration transducer 178. In various exemplary embodiments of the invention, spectral shaping techniques may be applied in the pulse width modulation function to reduce noise in the audible band.

In various exemplary embodiments of the invention, one or more control signals 219, one or more audio signals 221, one or more SSI signals 223, one or more mixed audio signals 225 and/or 226, and one or more signals 227 for driving a vibration transducer may be communicated between the DSP 154 and the digital portion 211. Monaural and/or stereo audio data may be extracted from RF signals received by the receiver 153 and processed by the DSP block 154 before being conveyed to the digital portion 211 of the processing device 164. One or more signals communicated between the DSP 154 and the digital portion 211 may be buffered. For example, voice signals may not be buffered while music and/or ringtone signals may be written to a first-in-first-out (FIFO) buffer by the DSP 154 and then fetched from the FIFO by the digital portion 211.

The one or more control signals 219 may configure operations of the digital portion 211 based, for example, on a resolution and/or sampling rate of signals being output by the DSP 154. In various embodiments of the invention, one or more control registers for the digital portion 211 may reside in the DSP 154. In various embodiments of the invention, the control signals 219 may comprise one or more interrupt signals.

The audio signals 221 may each comprise, for example, voice data, music data, or ringtone data. Each audio signal 221 may be monaural signal, a left stereo channel, or a right stereo channel. The digital portion 211 may condition and/or process the audio signals 221 for conveyance to one or more audio output devices and/or uplink paths. In various embodiments of the invention, the resolution and/or sample rate of the audio signals 221 may vary. Exemplary resolutions may comprise 16-bit and 18-bit resolution. Exemplary sample rates may comprise 8 kHz, 11.05 kHz, 12 kHz, 16 kHz, 22.05 kHz, 24 kHz, 32 kHz, 44.1 kHz, and 48 kHz.

The signal strength indicator (SSI) signals 223 may comprise one or more feedback signals from the digital portion 211 to the DSP 154. The SSI signals 223 may provide an indication of signal strength of one or more frequency bands of one or more audio signals 221, 225, and/or 226. The SSI signals 223 may, for example, be utilized by the DSP 154, the processor 156, the memory 158, or a combination thereof to control a digital gain factor applied to each sub-band of one or more audio signals 221, 225, and/or 226. In various embodiments of the invention, the SSI signals 223 may be utilized for audio visualizations. For example, one or more LEDs and/or an image on a display may be controlled based on audio signal strength.

The signal 227 may comprise audio data utilized to control a vibration transducer 178. The signal 227 may comprise, for example, CW tone data, voice data, music data, or ringtone data. Characteristics such as intensity of vibration, a pattern in which vibration is started and stopped, a frequency at which vibration may be started and stopped, and/or a duration of a vibration or sequence of vibrations may be controlled based on the signal 227.

The one or more mixed audio signals 225 and the one or more mixed audio signals 226 may be output by the digital portion 211 to the DSP 154. The mixed audio signals 225 may each be a composite signal comprising information from one or more monaural signals and/or stereo audio signals. Similarly, the mixed audio signals 226 may each be a composite signal comprising information from one or more monaural signals and/or stereo audio signals. In this regard, one or more of the audio signals 221, one or more of the input audio signals 235, one or more of the input audio signals 241, and/or one or more of the audio signals 217 may be mixed together. Each of the audio signals 221, 235, and 217 may be, for example, amplified, attenuated, band limited, up-converted, down-converted or otherwise processed and/or conditioned prior to mixing. The mixed audio signals 225 may be part of and/or coupled to an uplink path. For example, the signals 225 may be processed by the DSP 154 and transmitted, via the BT and/or USB subsystem 162, to a remote wireless system. Similarly, the mixed audio signal) 226 may be part of and/or coupled to an uplink path. For example, the signals 226 may be processed by the DSP 154 and transmitted, via the transmitter 152, to far-end communication partner or a remote wireless system.

Figure 3:
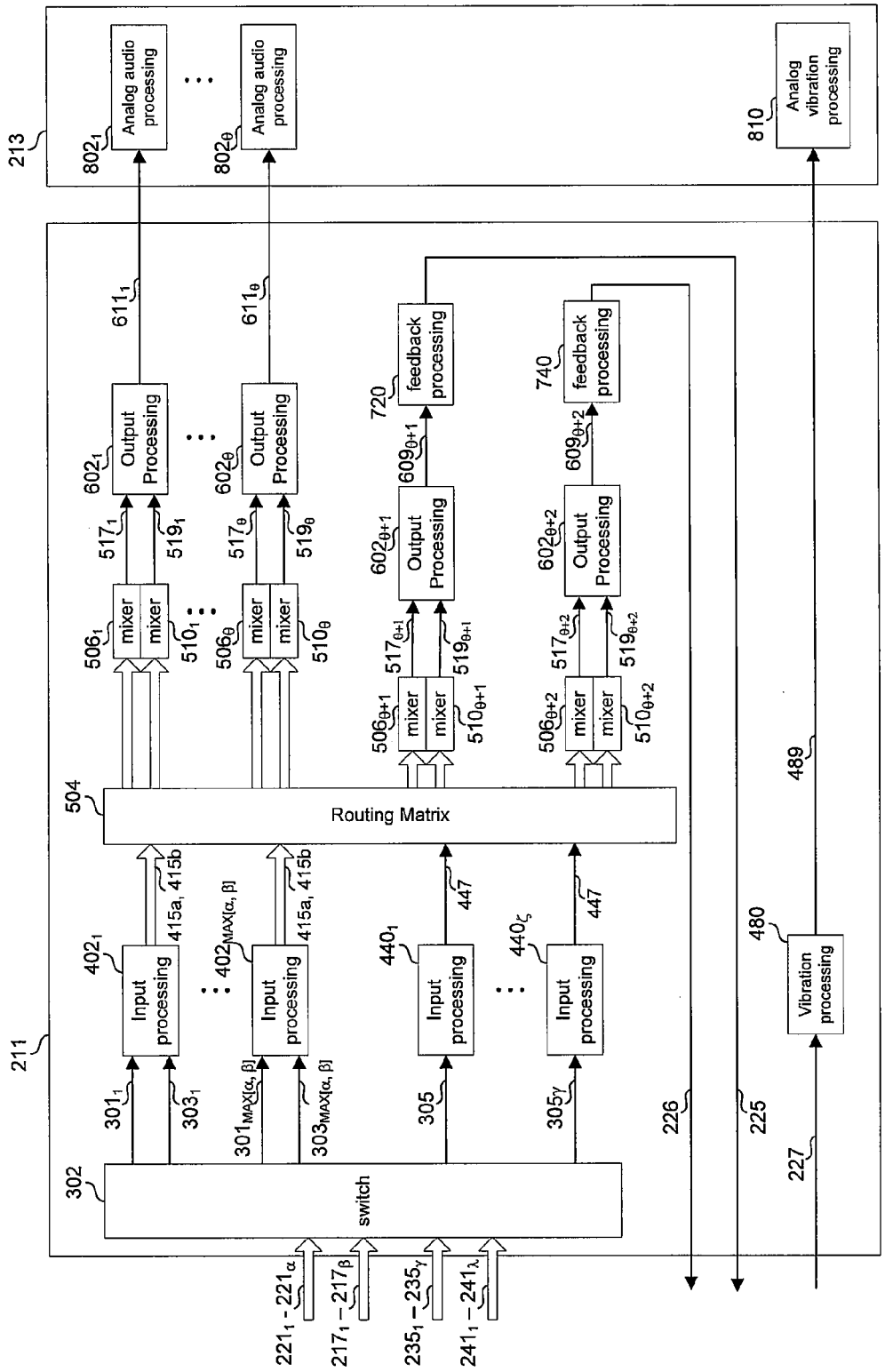
FIG. 3 is a block diagram illustrating details of exemplary digital processing and analog processing portions of an audio processing device, in accordance with an embodiment of the invention.

In operation, one or more baseband audio signals 217, 221, 235, and/or 241 may be conveyed to the audio processing device 164 from one or more of the DSP 154, the BT and/or USB subsystem 162, and the input and/or output devices 209. The digital portion 211 of the audio processing device 164 may select which baseband audio signals 221 to process. Each of the selected audio signals may be processed based on factors such as whether the signal is one of a pair of stereo signals or is a monaural signal; whether the signal comprises voice, music, or ringtone data; a resolution of the signal; and a sample rate of the signal. Selected audio signals may be processed in an input processing path comprising one or more input audio processing blocks 402 and/or 440 (FIG. 3). The input audio processing path may condition audio signals based on source and/or characteristics of the audio signal. In this regard, conditioning of audio signals by the input processing path may comprise detecting and controlling sub-band amplitudes of audio signals in order to maintain levels of signals 225, 226, 231, and/or 241 between determined thresholds while still presenting audio in an aurally pleasing manner. Subsequently, audio signals may be mapped from one or more input processing paths to one or more output processing paths. The output processing path may comprise one or more mixers 506 and/or 510 (FIG. 3), output audio processing blocks 602 (FIG. 3), feedback audio processing block 720

(FIG. 3), and/or feedback processing block 740 (FIG. 3). The output processing path may condition signals based on one or more output devices 209 and/or uplink paths to which the audio signals may be conveyed.

FIG. 3 is a block diagram illustrating details of exemplary digital processing and analog processing portions of an audio processing device, in accordance with an embodiment of the invention. Referring to FIG. 3, there is shown a digital portion 211 and an analog portion 213.

The digital portion 211 may comprise a switching element 302, a plurality of input audio processing blocks 402, a plurality of input audio processing blocks 440, a digital vibration processing block 480, a routing matrix 504, a plurality of mixers 506 and 510, a plurality of output audio processing blocks 602, a feedback audio processing block 720, and a feedback audio processing block 740.

The switching element 302 may be operable to route one or more of the signals $221_1 \ldots 221_\alpha$ (collectively referred to herein as signals 221), $217_1 \ldots 217_\beta$ (collectively referred to herein as signals 217), $235_1 \ldots 235_\gamma$ (collectively referred to herein as signals 235), and/or $241_1 \ldots 241_\lambda$ (collectively referred to herein as signals 241) from the DSP 154, BT and/or USB subsystem 162, and audio input devices 209 to the digital portion 211, where $\alpha, \beta, \gamma$ and $\lambda$ are integers greater than or equal to 1. Which signals 221, 217, 235, and/or 241 are routed to one or more input audio processing blocks 402 and/or 440 may be determined based on one or more control signals received from, for example, the DSP 154, the processor 156, and/or the BT and/or USB subsystem 162. In this regard, the switching element 302 may be configured dynamically and/or in real-time so as to provide processing whenever it may be required.

Each of the input audio processing blocks 402 may comprise suitable logic, circuitry, and/or code that may be operable to condition monaural or stereo input audio signals. Processing of an audio signal by each audio processing block 402 may be based on a type of audio content in the signal, a source of the audio signal, and/or a sample rate of the audio signal. Each audio processing block 402 may be operable to measure strength of one or more audio signals 301 and/or 303, in one or more frequency bands, and generate one or more feedback signals corresponding to the measured strength. In this regard, additional details of the input audio processing block 402 are described below with respect to FIGS. 4A-4E. Each of the input audio processing blocks 402 may be configured via one or more control signals received from, for example, the DSP 154, the processor 156, and/or the BT and/or USB subsystem 162. In this regard, the input audio processing blocks 402 may be configured dynamically and/or in real-time so as to provide processing whenever it may be required.

Each of the input audio processing blocks 440 may comprise suitable logic, circuitry, and/or code that may be operable to condition monaural input audio signals. Processing of an audio signal 305 by each audio processing block 440 may be based on a type of audio content in the signal 305, a source of the audio signal 305, and/or a sample rate of the audio signal 305. Each audio processing block may be operable to buffer an audio signal 305, to filter the audio signal 305, and/or up-sample or down-sample the audio signal 305. Each audio processing block 440 may be operable to adjust signal levels of the signal 447. In various embodiments of the invention, each of the input audio processing blocks 440 may be configured via one or more control signals received from, for example, the DSP 154, the processor 156, and/or the BT and/or USB subsystem 162. In this regard, the input audio processing blocks 440 may be configured dynamically and/or in real-time so as to provide processing whenever it may be required.

The digital vibration processing block 480 may comprise suitable logic, circuitry, and/or code that may be operable to process and/or condition one or more of the baseband audio signals to generate one or more signals 489 for controlling the vibration transducer 178. In this regard, the digital vibration processing block 480 may control vibrations based on an audio signal. In this regard, various characteristics such as intensity of vibration, a pattern in which vibration is started and stopped, a frequency at which vibration is started and stopped, and/or duration of a vibration or sequence of vibrations may be controlled based on an audio signal input to the digital vibration processing block 480. The digital vibration processing block 480 may be configured via one or more control signals received from, for example, the DSP 154, the processor 156, and/or the BT and/or USB subsystem 162. In this regard, the digital vibration processing block 480 may be configured dynamically and/or in real-time so as to provide processing whenever it may be required.

The routing matrix 504 may comprise suitable logic, circuitry, and/or code operable to route each of the signals 415 and 447 to one or more of the mixers 506 and/or 510. The routing matrix 504 may be configured via one or more control signals from, for example, the processor 156, the DSP 154, and/or the memory 158. Moreover, configuration of the routing matrix 504 may occur dynamically and/or in real-time so as to provide processing whenever it may be required. In various embodiments of the invention, the routing matrix 504 may comprise one or more multiplexers or similar switching elements. Routing of each input signal 415 and/or 447 may depend, at least in part, on an output device 209 and/or uplink path for which each signal 415 and 447 may be destined. In this regard, the routing and re-routing of signals between inputs and outputs of the audio processing device 164 may occur in real-time. Routing of each input signal 415 and/or 447 may be independent of the routing of other input signals 415 and 447, independent of the source of each signal 415 and/or 447, and independent of whether each signal 415 and/or 447 is a stereo channel or a monaural channel. Thus, upstream from the routing matrix 504 audio signals may be processed according to an input of the processing device 164 on which the audio signals where received and downstream from the routing matrix 504 audio signals may be processed based on an output of the processing device 164 for which the signals are destined. In this manner, the processing device 164 may provide flexibility in routing audio signals of various types and from various sources to one or more audio output devices and/or uplink paths. Upstream from the routing matrix 504 may comprise the input audio processing blocks 402 and 440. Downstream from the routing matrix 504 may comprise the mixers 506 and 510, the output audio processing blocks 602, the feedback audio processing block 720, and the feedback audio processing block 740.

The mixers 506 and 510 may each comprise suitable logic, circuitry, and/or code operable to combine audio signals into a composite audio signal. Each mixer 506 may combine up to $\eta$ audio signals to generate a composite audio signal 517. Similarly each mixer 510 may combine up to $\eta$ audio signals to generate a composite audio signal 519. In various embodiments of the invention, each signal $517_1 \ldots 517_{\theta+2}$, may be a left stereo channel and each signal $519_1 \ldots 519_{\theta+2}$, may be a right stereo channel. In an exemplary embodiment of the invention, the mixers 506 and 510 may output up to $\theta+2$ stereo signals or up to $2(\theta+2)$ monaural signals to a number, $\theta$, of analog audio processing blocks 802, a feedback audio processing block 720, and a feedback audio processing block 740 via the output audio processing blocks 602. The mixers 506 and 510 may be configured via one or more control signals from, for example, the processor 156, the DSP 154, and/or the memory 158. In this regard, the mixers 506 and/or 510 may be configured dynamically and/or in real-time so as to provide processing whenever it may be required.

Each output audio processing blocks 602 may comprise suitable logic, circuitry, and/or code that may be operable to process audio signals for conveyance to one or more analog audio processing blocks 802, a feedback audio processing block 720, and a feedback audio processing block 740. Each output processing block may be operable to filter, up-sample, and $\Delta\Sigma$ modulate audio signals. Additionally, each output audio processing block 602 may be operable to control an attenuation applied to the signals 609 and 611 to prevent over-driving an audio output device and/or uplink processing path.

The feedback audio processing block 720 may comprise suitable logic, circuitry, and/or code that may be operable to process and/or condition one or more of the baseband audio signals to generate one or more signals 225 In various embodiments of the invention, one or more signals 225 may be conveyed to an uplink signal path via the DSP 154 and/or the BT and/or USB subsystem 162. In this regard, the audio signal 225 may comprise voice, music, and/or ringtone data which may be communicated to a remote wireless device utilizing BT and/or USB protocols. In various embodiments of the invention, one or more signals 225 may be conveyed to an output device such as the BT headset 172 via the BT and/or USB subsystem 162. The feedback audio processing block 720 may be operable to up-sample and/or down-sample audio signals, adjust signal levels of the output signal 225, and/or buffer audio signals. The feedback audio processing block 720 may be configured via one or more control signals received from, for example, the DSP 154, the processor 156, and/or the BT and/or USB subsystem 162. In this regard, the feedback audio processing block 720 may be configured dynamically and/or in real-time so as to provide processing whenever it may be required.

The feedback audio processing block 740 may comprise suitable logic, circuitry, and/or code that may be operable to process and/or condition one or more of the baseband audio signals to generate one or more signals 226 which may be conveyed to an uplink signal path via the DSP 154 and/or transmitter 152. In this regard, the audio signal 226 may comprise voice, music, and/or ringtone data which may be communicated to a remote wireless device utilizing, for example, cellular, WLAN, PAN and/or broadcast audio protocols. The feedback audio processing block 740 may be operable to up-sample and/or down-sample audio signals. The feedback audio processing block 740 may be configured via one or more control signals received from, for example, the DSP 154, the processor 156, and/or the BT and/or USB subsystem 162. In this regard, the feedback audio processing block 740 may be configured dynamically and/or in real-time so as to provide processing whenever it may be required.

Each of the analog audio processing blocks 802 may comprise suitable logic, circuitry, and/or code that may be operable to condition audio signals for driving an audio output device 209. Each analog audio processing block 802 may be operable to convert a digital audio signal to an analog representation. Each analog audio processing block 802 may be operable to buffer and/or amplify analog audio signals for driving an audio output device 209. The analog audio processing blocks 802 may be configured via one or more control signals received from, for example, the DSP 154, the processor 156, and/or the BT and/or USB subsystem 162. In this regard, the analog audio processing blocks 802 may be configured dynamically and/or in real-time so as to provide processing whenever it may be required.

The analog vibration processing block 810 may comprise suitable logic, circuitry, and/or code that may be operable to buffer and/or amplify the signal 489 for driving the vibration transducer 178. In this regard, driving the vibration transducer 178 may require more current than the digital vibration processing block 480 may be able to output and thus the analog vibration processing block 810 may provide increased output current for driving the vibration transducer 178. The analog vibration processing block 810 may be configured via one or more control signals received from, for example, the DSP 154, the processor 156, and/or the BT and/or USB subsystem 162. In this regard, the analog vibration processing block 810 may be configured dynamically and/or in real-time so as to provide processing whenever it may be required.

In operation, the switching element 302 may select one or more audio signals to be routed to one or more of the input audio processing blocks 402 and/or the input audio processing blocks 440. Each of the input audio processing blocks 402 and/or 440 may condition audio signals and convey them to the routing matrix 504. The input audio processing blocks 402 may each generate one or more feedback signals. The feedback signals may be utilized to control sub-band amplitudes of the signals 415a and 415b and/or to generate one or more audio visualizations. The routing matrix 504 may route the audio signals to one or more mixers 506 and/or 510. Each mixer 506 and/or 510 may mix together one or more audio signals into a composite audio signal 517 and/or 519. The signals 517 and/or 519 may each be conveyed to an output audio processing block 602. Each output audio processing block 602 may condition audio signals for conveyance to an analog audio processing block 802, the feedback audio processing block 720, or the feedback audio processing block 740. The signals $611_1, \ldots, 611_\theta$ may each be conveyed to an analog processing path 802 which may convert the signals $611_1, \ldots, 611_\theta$ to an analog representation and buffer and/or amplify the analog audio signal to drive an audio output device 209. The signal $609_{\theta+1}$ may be conveyed to the feedback audio processing block 720 which may condition the signal $609_{\theta+1}$ for transmission to a remote wireless device. The signal $609_{\theta+2}$ may be conveyed to the feedback audio processing block 740 which may condition the signal $609_{\theta+2}$ for transmission to a remote wireless device.

Figure 4A:
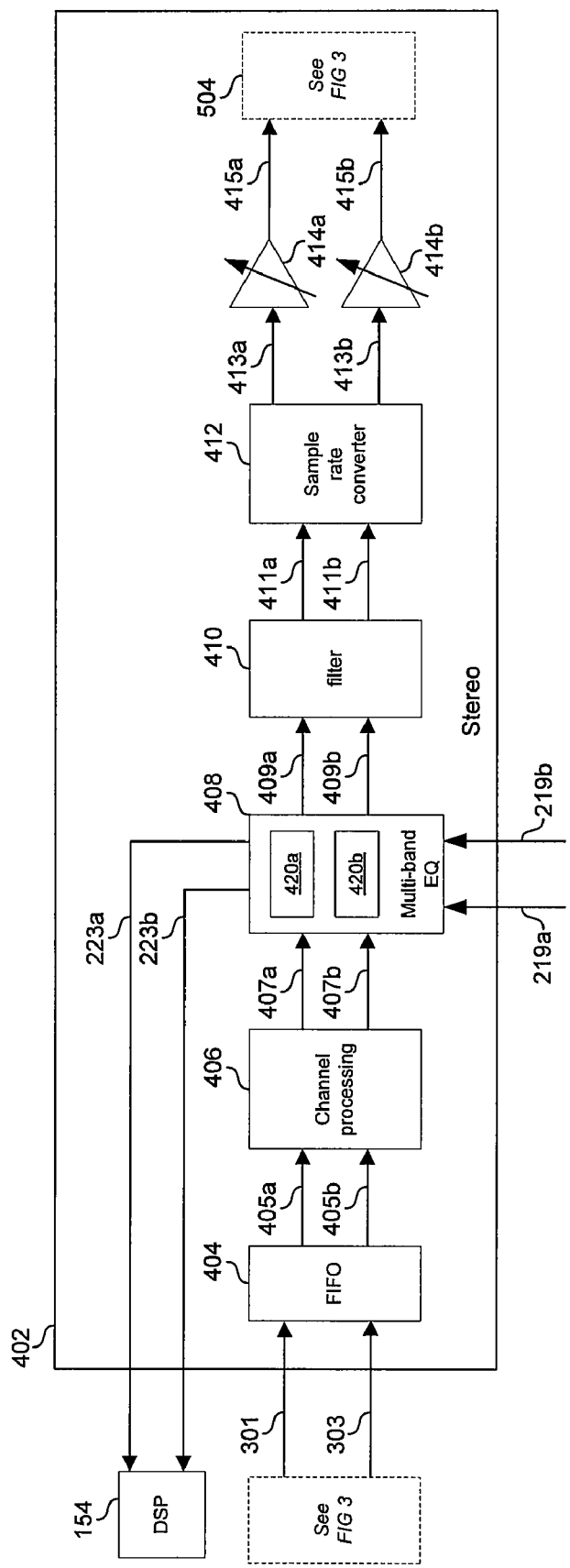
FIG. 4A is a block diagram illustrating a high(er) bandwidth input audio processing block of an audio processing device, in accordance with an embodiment of the invention.

FIG. 4A is block diagram illustrating a high(er) bandwidth input audio processing block of an audio processing device, in accordance with an embodiment of the invention. Referring to FIG. 4A, there is shown an input audio processing block 402 comprising a FIFO 404, a channel processing block 406, a multi-band equalizer 408, a filter 410, a sample rate converter 412, and digital gain blocks 414a and 414b. In an exemplary embodiment of the invention, the digital portion 211 may comprise a number of input audio processing blocks 402 equal to the number of signals 301 or 303. In this regard, the number of input audio processing blocks 402 may be equal to the maximum of $\delta$ and $\epsilon$, where $\delta$ is the number of signals 301 and $\epsilon$ is the number of signals 303. In instances, for example, that each input audio processing block 402 processes a pair of stereo signals, then $\delta$ and $\epsilon$ may be equal.

The FIFO 404 may comprise suitable logic, circuitry, and/or code that may be operable to buffer audio data. In this regard, the FIFO 404 may comprise one or more memory elements.

The channel processing block 406 may comprise suitable logic, circuitry, and/or code that may be operable to enable the input audio processing block 402 to handle stereo and monaural audio signals. In an exemplary embodiment of the invention, the channel processing block 406 may be configured such that signal 405*a* may be output as signal 407*a* and/or signal 407*b*, signal 405*b* may be output as signal 407*a* and/or 407*b*, and/or signals 405*a* and 405*b* may be mixed or combined and output as signal 407*a* and/or 407*b*. In various exemplary embodiments of the invention, the signal 407*a* may correspond to a left stereo channel and the signals 407*b* may correspond to a right stereo channel. The channel processing block 406 may be configured via one or more control signals from, for example, the processor 156, the DSP 154, and/or the memory 158. In this regard, the channel processing block 406 may be configured dynamically and/or in real-time so as to provide processing whenever it may be required.

The multi-band equalizer 408 may comprise two multi-band equalizer blocks 420*a* and 420*b* which may each be operable to process a monaural signal one channel of a stereo signal. The equalizer blocks 420*a* and 420*b* may each comprise suitable logic, circuitry, and/or code that may be operable to independently adjust signal levels of signals 409*a* and 409*b* in each of one or more frequency bands and to generate SSI signals 223*a* and 223*b*, respectively, based on measured voltage, current, and/or power of the signals 409*a* and 409*b*, respectively. The signals 223*a* and 223*b* may be collectively referred to herein as signals 223. In this regard, the signal 223*a* may comprise an indication of strength of the signal 409*a* in one or more frequency bands. In an exemplary embodiment of the invention, the signal 223*a* may indicate signal strength of the signals 409*a* in each of five frequency bands. Similarly, the signal 223*b* may comprise an indication of strength of the signal 409*b* in one or more frequency bands. In an exemplary embodiment of the invention, the signal 223*b* may indicate signal strength of the signals 409*b* in each of five frequency bands. The multi-band equalizer 408 may be configured via one or more control signals from, for example, the processor 156, the DSP 154, and/or the memory 158. In this regard, the multi-band equalizer 408 may be configured dynamically and/or in real-time. Additional details of the multi-band equalizer blocks 420*a* and 420*b* are described below with respect to FIGS. 4B-4E.

The filter 410 may comprise suitable logic, circuitry, and/or code that may be operable to attenuate undesired frequencies to a greater extent than desired frequencies. The filter 410 may comprise, for example, a finite impulse response (FIR) filter and/or an infinite impulse response filter (IIR). In various embodiments of the invention, filter parameters may be configured based on the signals 301 and 303 being processed. For example, the filter 410 may be utilized as a de-emphasis filter for audio input from, for example a compact disc, or may be utilized as an anti-aliasing filter. The filter 410 may be configured via one or more control signals from, for example, the processor 156, the DSP 154, and/or the memory 158. In this regard, the filter 410 may be configured dynamically and/or in real-time so as to provide processing whenever it may be required.

The sample rate converter 412 may comprise suitable logic, circuitry, and/or code that may be operable to convert a variety of audio signal sample rates to a single and/or common sample rate. In this regard, the sample rate converter may be enabled to up-sample and/or down-sample an audio signal. The sample rate converter 412 may be configured via one or more control signals from, for example, the processor 156, the DSP 154, and/or the memory 158. In this regard, the sample rate converter 412 may be configured dynamically and/or in real-time so as to provide processing whenever it may be required.

The digital gain blocks 414*a* and 414*b* may each comprise suitable logic, circuitry, and/or code that may be operable to adjust an amplitude and/or intensity of digital audio signals 413*a* and 413*b*. In this regard, the signals 415*a* and 415*b* may be scaled versions of the signals 413*a* and 413*b*, respectively. The digital gain blocks 414*a* and 414*b* may be configured via one or more control signals from, for example, the processor 156, the DSP 154, and/or the memory 158. In this regard, the sample digital gain blocks 414*a* and 414*b* may be configured dynamically and/or in real-time so as to provide processing whenever it may be required.

The signals 301 and 303 may be high(er) bandwidth audio signals comprising, for example, music and/or ringtone data. The signals 301 and 303 may be, for example, a left stereo channel and a right stereo channel or two monaural signals.

In operation, the audio data of the signals 301 and 303 may be buffered by the FIFO 404. Subsequently, the buffered audio data may be conveyed to the channel processing block 406 which may determine which data to output as signal 407*a* and which data to output as signal 407*b*. For example, in instances that the signals 301 and 303 comprise stereo audio data, the channel processing block 406 may output left channel audio data as signal 407*a* and right channel audio data as signal 407*b*. For another example, in instances that the signals 301 and 303 are two monaural signals, the channel processing block 406 may output signal 301 as a left stereo channel and the signal 303 as a right stereo channel. For another example, in instances that signal 301 may be absent, the channel processing block 406 may output the signal 303 as both signals 407*a* and 407*b*. For another example, the channel processing block 406 may mix the signals 301 and 303 and output the same monaural signal, comprising data from both signals 301 and 303, as signals 407*a* and 407*b*.

Outputs of the channel processing block 406 may be conveyed to the multi-band equalizer 408. The multi-band equalizer may independently adjust signal levels of the signals 407*a* and 407*b* on each band to generate signals 409*a* and 409*b*. The level adjustments may be based on control commands from the DSP 154 or the processor 165. The multi-band equalizer 408 may measure strength of the signals 409*a* and 409*b*, in one or more frequency bands, and generate the SSI signals 223 based on the measurement(s). The signals 223 may be conveyed to the DSP 154 and may be utilized to, for example, control gain or attenuation applied to each sub-band of the signals 409*a* and 409*b*. The signals 223 may be conveyed to the DSP 154 and may be utilized to, for example, control one or more LEDs or images for audio visualization. In this regard, audio signals may be compressed, expanded, filtered, or otherwise processed with reference to a subjective loudness curve. In various embodiments of the invention, gain control based on the feedback signals 223 may enable protecting against over-driving an output audio device 209 while still maintaining acceptable audio characteristics.

After being measured and conditioned by the multi-band equalizer 408, the audio signals 409*a* and 409*b* may be conveyed to the filter 410. The filter 410 may filter the signals 409*a* and 409*b* based on, for example, whether the audio signals comprise music or ringtone data, whether the signals may be stereo or monaural signals, and/or what input device or downlink path the signals may be from. The filter 410 may output signals 411*a* and 411*b* to the sample rate converter 412. The sample rate converter 412 may convert the signals 411*a* and 411*b* to a determined sample rate such that a plurality of audio signals conveyed to the routing matrix 504 (FIG. 3) may be of the same sample rate. In this manner, the digital portion 211 may be enabled to receive audio signals with a variety of sample rates. Utilizing a common sample rate for all signals conveyed to the routing matrix 504 may reduce cost and/or complexity of the routing matrix 504 and subsequent downstream components.

The outputs 413a and 413b of the sample rate converter 412 may be conveyed to the digital gain blocks 414a and 414b, respectively. The gain blocks 414a and 414b may scale the audio signals 413a and 413b to output the signals 415a and 415b. In this regard, the gain blocks 414a and 414b may be operable to control an amplitude or volume of each of the audio signals 415a and 415b conveyed to the routing matrix 504.

Figure 4B:
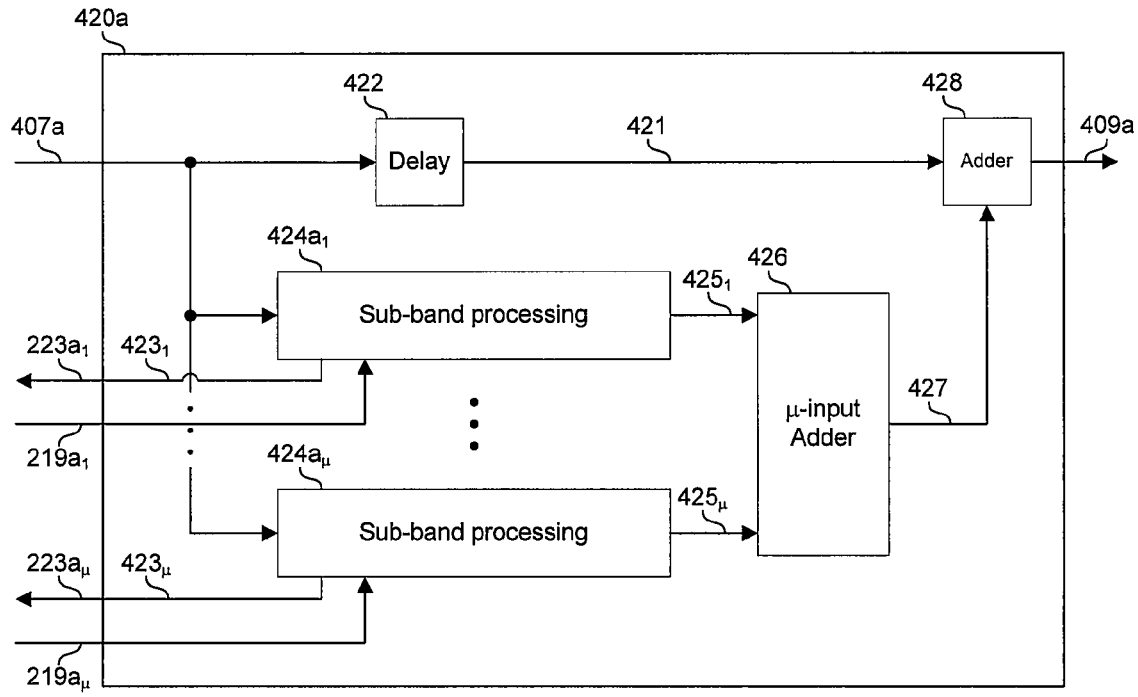
FIG. 4B is a block diagram illustrating a multi-band equalizer block for detecting and controlling sub-band amplitudes of an audio signal.

FIG. 4B is a block diagram illustrating a multi-band equalizer block for detecting and controlling sub-band amplitudes of an audio signal. Referring to FIG. 4B the equalizer block 420a may comprise a delay block 422, sub-band processing blocks 424a$_1$, . . . , 424a$_\mu$, and adders 426 and 428. Although multi-band equalizer block 420a is described herein, multi-band equalizer block 420b may be substantially the same as the multi-band equalizer block 420a.

The delay block 422 may comprise suitable logic, circuitry, and/or code that may be operable to delay the input signal 407a such that the direct path signal 421 may be added to the signal 427. In this regard, the delay 422 may delay the signal by an amount similar or equal to the delay introduced by each sub-band processing block 424.

The sub-band processing blocks 424a$_1$, . . . , 424a$_\mu$ may each comprise suitable logic, circuitry, and/or code that may be operable to detect the amplitude of a sub-band of the signal 407a and control a gain applied to the sub-band. Additional details of the exemplary sub-band processing block 424a$_1$ are described below with respect to FIGS. 4C-4E. In an exemplary embodiment of the invention, $\mu$ may be 5.

The adder 426 may comprise suitable logic, circuitry, and/or code that may be operable to sum the outputs of the sub-band processing blocks 424a$_1$, . . . , 424a$_\mu$. The adder 428 may comprise suitable logic, circuitry, and/or code operable to sum signal 427, the combined outputs of the sub-band processing blocks 424a$_1$, . . . , 424a$_\mu$, and signal 421, the delayed version of the signal 407a.

In operation, an audio signal 407a may be input to the equalizer block 420. The sub-band processing blocks 424a$_1$, . . . , 424a$_\mu$ may delay, detect an amplitude of, and apply a gain to sub-bands 1, . . . , $\mu$, respectively. In an exemplary embodiment of the invention, for an audio signal with a bandwidth of $f_A$ Hz, the sub-band processing blocks 424a$_1$, . . . , 424a$_\mu$ may process sub-bands of bandwidth $f_A/\mu$ centered at $(1\frac{1}{2})*(f_A/\mu)$, $(2\frac{1}{2})*(f_A/\mu)$, . . . , $(\mu-\frac{1}{2})*(f_A/\mu)$, respectively. The measured sub-band amplitudes may be output as signals 223a$_1$, . . . , 223a$_\mu$. The gain applied to the sub-bands may be controlled by the signals 219a$_1$, . . . , 219a$_\mu$. The outputs of sub-band processing blocks 424a$_1$, . . . , 424a$_\mu$ may be summed by the adder 426. The output 427 of the adder 428 may be summed with the direct path signal 421 to generate the audio signal 409a.

Figure 4C:
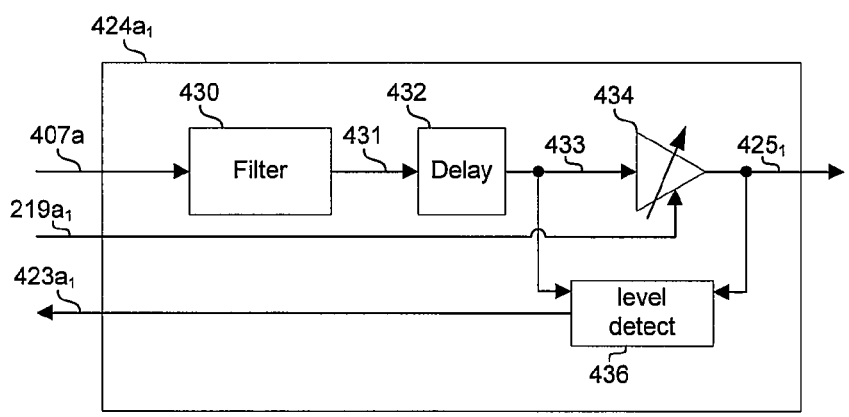
FIG. 4C is a block diagram illustrating an exemplary audio sub-band processing module, in accordance with an embodiment of the invention.

FIG. 4C is a block diagram illustrating details of an exemplary audio sub-band processing block, in accordance with an embodiment of the invention. Referring to FIG. 4C, the audio sub-band processing block 424 may comprise a filter 430, a delay block 432, a digital gain block 434, and a level detect block 436. Although audio sub-band processing block 424a$_1$ is described herein, audio sub-band processing blocks 424a$_2$, . . . , 424a$_\mu$ may be substantially the same as the audio sub-band processing block 424a$_1$.

The filter 430 may comprise suitable logic, circuitry, and/ or code operable to select a sub-band of the signal 407a. In this regard, the filter 430 may be a bandpass or lowpass filter with a bandwidth and/or a center frequency, which may be determined based on the number of sub-bands to be processed and/or characteristics of the audio signal 407a. The filter 430 may be configured via one or more control signals from, for example, the processor 156, the DSP 154, and/or the memory 158. In this regard, the filter 430 may be configured dynamically and/or in real-time. Details of an exemplary filter 430 are described below with respect to FIG. 4D.

The delay block 432 may be similar to the delay block 422 described with respect to FIG. 4B. The delay introduced by the delay block 432 may be determined based on the bandwidth and/or center frequency of the filter 430. In this regard, the delay block 432 may be operable to offset frequency dependent delays introduced by the filter 430 and/or the gain block 434. Accordingly, the delay of the sub-band processing block 424 may be relatively independent of frequency.

The digital gain block 434 may comprise suitable logic, circuitry, and/or code operable to control the amplitude of the sub-band signal 425$_1$. The gain of the digital gain block 434 may be based on the signal 223a$_1$ output by the amplitude detect block 436. In this regard, the detected amplitude may be conveyed to, for example, the processor 156, the DSP 154, and/or the memory 158. Accordingly, the processor 156, the DSP 154, and/or the memory 158 may generate the signal 219a$_1$ to control the gain of the digital gain block 434. In this manner, the digital gain block 434 may be configured dynamically and/or in real-time. In some embodiments of the invention, the gain of the digital gain block 434 may be fixed for one or more sub-bands. For example, the gain of the digital gain block 434 may be designed together with the coefficients of the filter 430 to match a pre-defined frequency response mask. For example, the pre-defined frequency response may emphasize lower frequencies (bass) or higher frequencies (treble).

The level detect block 436 may comprise suitable logic, circuitry, and/or code that may be operable to detect signal amplitude and convey the detected amplitude to, for example, the DSP 154. Additional details of the level detect block 436 are described below with respect to FIG. 4E.

In operation, the sub-band processing block 424a may process a sub-band of the audio signal 407a. In this regard, the signal 407a may arrive at the filter 430 and the filter 430 may pass frequencies within the sub-band and block signals outside the sub-band to generate the sub-band signal 431. The delay block 432 may delay the sub-band signal 431 to generate the delayed sub-band signal 433. The amount of delay may be based on the center frequency and/or bandwidth of the sub-band. The digital gain block 434 may amplify, attenuate, or buffer the delayed sub-band signal 433 to output the level-adjusted sub-band signal 425$_1$. The gain of the digital gain block 434 may be determined by the control signal 219a$_1$ generated by, for example, the processor 156, the DSP 154, and/or the memory 158. In some embodiments of the invention, the signal 219a$_1$ may be determined based on the value of the detected amplitude signal 423 output by the level detect block 436. In some embodiments of the invention, the gain may be controlled such that the signal 219a$_1$ may be of constant amplitude regardless of the detected signal amplitude.

Figure 4D:
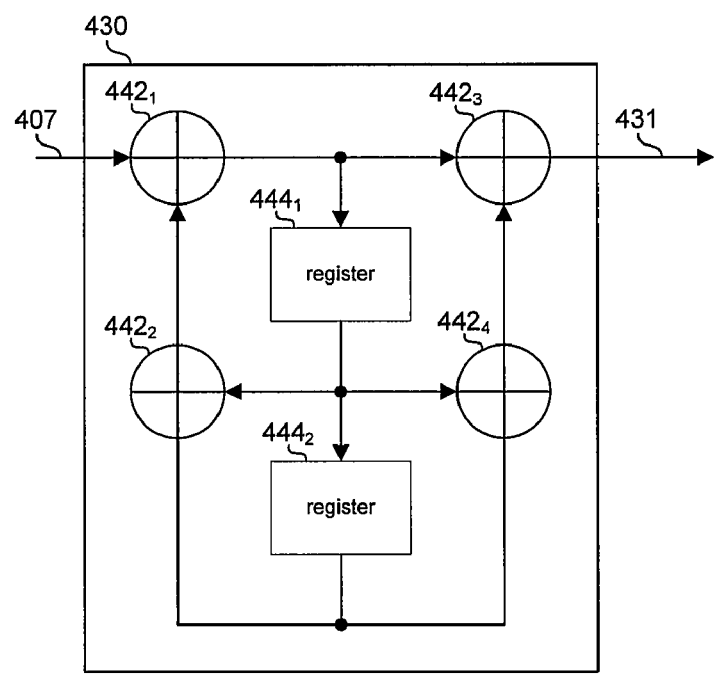
FIG. 4D is a block diagram illustrating an exemplary filter for selecting audio sub-bands, in accordance with an embodiment of the invention.

FIG. 4D is a block diagram illustrating an exemplary filter for selecting audio sub-bands, in accordance with an embodiment of the invention. Referring FIG. 4D the filter 430 may comprise adders 442$_1$, . . . , 442$_4$, and registers 444$_1$ and 444$_2$. In this regard, the exemplary filter may be an IIR filter implemented in the form of a biquad. The adders 442$_1$, . . . , 442$_4$ may comprise suitable logic, circuitry, and/or code operable to sum two digital audio signals to output a third digital audio signal. The registers 444$_1$, . . . , 444$_2$ may comprise one or more storage elements, such as latches and/or flip flops. In operation, the filter 430 may receive the audio signal 407 and output the sub-band signal 431.

Figure 4E:
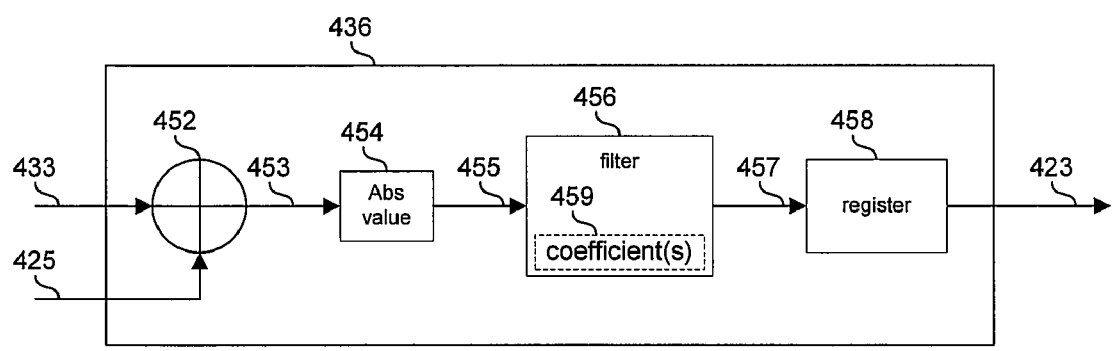
FIG. 4E is a block diagram illustrating an exemplary level detect module, in accordance with an embodiment of the invention.

FIG. 4E is a block diagram illustrating an exemplary level detect module, in accordance with an embodiment of the invention. Referring to FIG. 4E the level detect block 436 may comprise an adder 452, an absolute value block 454, a filter 456, and a register 458.

The adder 452 may comprise suitable logic, circuitry, and/or code operable to sum the delayed sub-band signal 433 and the level-adjusted sub-band signal 435 to output a sum signal 453.

The absolute value block 454 may comprise suitable logic, circuitry, and/or code that may be operable to output an amplitude signal 455 corresponding to the amplitude of the sum signal 453. In this manner, negative values of the sum signal 453 may be inverted to become positive values. In an exemplary embodiment of the invention, the absolute value block 454 may be an envelope detector.

The filter 456 may comprise suitable logic, circuitry, and/or code operable to generate the filtered signal 457 corresponding to the average value of the amplitude signal 455. A response of the filter 456 may be determined, at least in part, by coefficient(s) 459. The coefficient(s) 459 may be configured by, for example, the processor 156, the DSP 154, and/or the memory 158. In this regard, the coefficient(s) 459 may be configured dynamically and/or in real-time. In an exemplary embodiment of the invention, the filter 456 may be a single pole infinite impulse response (IIR) filter.

The register 458 may comprise one or more storage elements, such as latches and/or flip flops. The register 458 may be read by, for example, the processor 156 and/or the DSP 154.

In operation, the delayed sub-band signal 433 and level-adjusted sub-band signal 435 may be summed to generate the sum signal 453. In this regard, by summing signals 433 and 435, the detected amplitude 423 may closely approximate the amplitude of the signal 409 in the sub-band on which the level-detect block 436 operates. The sum signal 453 may be processed by the absolute value block 454 to output the current amplitude signal 455 which may conveyed to the filter 456. The filter 456 may determine the average or integrated value of the current amplitude signal 455 and output the average amplitude signal 457. The average amplitude signal 457 may be stored in the register 458. The DSP 154 may read the detected amplitude 423 from the register 458 as needed.

Figure 5:
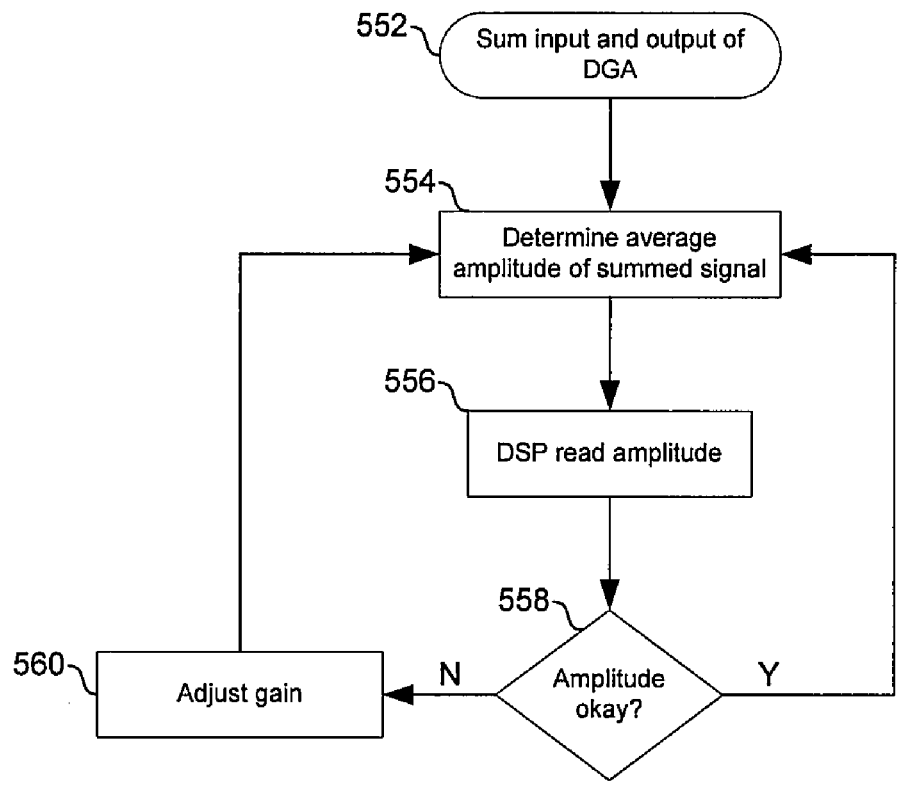
FIG. 5 is a flowchart illustrating exemplary steps for controlling audio signal sub-band amplitudes, in accordance with an embodiment of the invention.

FIG. 5 is a flowchart illustrating exemplary steps for controlling audio signal sub-band amplitudes, in accordance with an embodiment of the invention. Referring to FIG. 5, the exemplary steps may begin in step 552 with an input 433 of the digital gain block 434 and an output 435 of the digital gain block 434 being summed to generate the signal 453. Subsequent to step 552, the exemplary steps may advance to step 554. In step 554, an absolute value of the signal 453 may be filtered such that the average amplitude of the signal 453 may be determined. The average amplitude may be the detected amplitude and may be stored in the memory element 458. Subsequent to step 554, the exemplary steps may advance to step 556. In step 556, the detected amplitude may be read from memory element 158 by, for example, the DSP 154. Subsequent to step 556, the exemplary steps may advance to step 558. In step 558, the detected amplitude may be compared, by the DSP 154 or the processor 156, for example, to one or more references or thresholds in order to determine whether to adjust the gain of the digital gain block 434. In this regard, the detected amplitude may be utilized in conjunction with a current gain setting of the digital gain block 434. In instances that the detected amplitude is determined to be within desired limits, the exemplary steps may return to the previously described step 554.

Returning to step 558, in instances that the detected amplitude is determined to be outside of determined limits, the exemplary steps may advance to step 560. In step 560 the gain of the digital gain block 434 may be adjusted by ramping the gain up or down. In an exemplary embodiment of the invention, the gain may be ramped in 0.25 dB increments over v samples of the audio signal. Accordingly, the gain of the digital gain block may be ramped from the current gain, $G_{crnt}$, to a target gain, $G_{trgt}$, in $4*(G_{crnt}-G_{trgt})*v$ samples.

Aspects of a method and system for multi-band amplitude estimation and gain control in an audio CODEC are provided. In certain embodiments of the invention, an audio signal 407a may be filtered by a filter 430 and delayed by a delay block 432 to generate one or more sub-band signals 433, a gain may be applied by a gain block 434 to each sub-band signal 433 to generate one or more level adjusted sub-band signals 425, and the one or more level adjusted signals 425 may be added to a delayed version 421 of the audio signal 407a. The gain applied to a particular one of the one or more sub-band signals 433 may be controlled based on a detected amplitude of a summed signal 453 derived by summing the particular one of the one or more sub-band signals 433 and a corresponding one of the one or more level-adjusted sub-band signals 425. The amplitude of the summed signal 453 may be detected utilizing an envelope detector. The gain may be controlled based on a subjective loudness curve. The gain may be controlled utilizing a look-up table. The gain may be controlled based on an audio output device 209 for which the audio signal 407a may be destined. The gain may be controlled based on an input device 209 from which the audio signal originated. The detected amplitude may be compared to a reference value to determine a target value of the gain, and the gain may be repeatedly incrementing over a plurality of samples to adjust the gain to the target value.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for audio level detection and control.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. One embodiment may utilize a commercially available processor, which may be implemented external to an ASIC implementation of the present system. Alternatively, in an embodiment where the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for signal processing, comprising:
   filtering and delaying an audio signal to generate one or more sub-band signals;
   applying a gain, using a gain circuit, to each of said one or more sub-band signals to generate one or more level-adjusted sub-band signals,
   wherein the gain circuit is adjusted to apply the gain in correspondence with a detected amplitude of a summed signal derived by summing a particular one of said one or more sub-band signals and a corresponding one of said one or more level-adjusted sub-band signals; and
   adding said corresponding one of said one or more level-adjusted sub-band signals to a delayed version of said audio signal.

2. The method according to claim 1, comprising detecting said amplitude of said summed signal utilizing an envelope detector.

3. The method according to claim 1, comprising controlling said gain based on a subjective loudness curve.

4. The method according to claim 1, comprising controlling said gain utilizing a look-up table.

5. The method according to claim 1, comprising controlling said gain based on an audio output device for which said audio signal is destined.

6. The method according to claim 1, comprising controlling said gain based on an audio input device from which said audio signal originated.

7. The method according to claim 1, comprising comparing said detected amplitude to a reference value to determine a target value of said gain.

8. The method according to claim 7, comprising repeatedly incrementing said gain over a plurality of samples of said audio signal to adjust said gain to said target value.

9. The method according to claim 1, comprising applying said gain such that adding said one or more level-adjusted sub-band signals to said audio signal results in a signal with a pre-defined frequency response.

10. The method according to claim 1, comprising controlling one or more audio visualizations based on said detected amplitude.

11. A system for signal processing, comprising:
    one or more circuits of a hardware audio CODEC operable to:
    filter and delay an audio signal to generate one or more sub-band signals;
    apply a gain, using a gain circuit, to each of said one or more sub-band signals to generate one or more level-adjusted sub-band signals,
    wherein the gain circuit is adjusted to apply the gain in correspondence with a detected amplitude of a summed signal derived by summing a particular one of said one or more sub-band signals and a corresponding one of said one or more level-adjusted sub-band signals; and
    add said corresponding one of said one or more level-adjusted sub-band signals to a delayed version of said audio signal.

12. The system according to claim 11, wherein said one or more circuits are operable to detect said amplitude of said summed signal utilizing an envelope detector.

13. The system according to claim 11, wherein said one or more circuits are operable to control said gain based on a subjective loudness curve.

14. The system according to claim 11, wherein said one or more circuits are operable to control said gain utilizing a look-up table.

15. The system according to claim 11, wherein said one or more circuits are operable to control said gain based on an audio output device for which said audio signal is destined.

16. The system according to claim 11, wherein said one or more circuits are operable to control said gain based on an audio input device from which said audio signal originated.

17. The system according to claim 11, wherein said one or more circuits are operable to compare said detected amplitude to a reference value to determine a target value of said gain.

18. The system according to claim 17, wherein said one or more circuits are operable to repeatedly increment said gain over a plurality of samples of said audio signal to adjust said gain to said target value.

19. The system according to claim 11, comprising applying said gain such that adding said one or more level-adjusted sub-band signals to said audio signal results in a signal with a pre-defined frequency response.

20. The system according to claim 11, comprising controlling one or more audio visualizations based on said detected amplitude.

* * * * *